United States Patent
Tsai et al.

(10) Patent No.: US 11,195,867 B2
(45) Date of Patent: Dec. 7, 2021

(54) HIGH DIELECTRIC CONSTANT DIELECTRIC LAYER FORMING METHOD, IMAGE SENSOR DEVICE, AND MANUFACTURING METHOD THEREOF

(71) Applicant: Taiwan Semiconductor Manufacturing Co., Ltd., Hsinchu (TW)

(72) Inventors: Tsung-Han Tsai, Zhunan Township (TW); Horng-Huei Tseng, Hsinchu (TW); Chun-Hao Chou, Tainan (TW); Kuo-Cheng Lee, Tainan (TW); Yung-Lung Hsu, Tainan (TW); Yun-Wei Cheng, Taipei (TW); Hsin-Chieh Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/923,661

(22) Filed: Jul. 8, 2020

(65) Prior Publication Data

US 2020/0343279 A1    Oct. 29, 2020

Related U.S. Application Data

(60) Continuation of application No. 16/718,581, filed on Dec. 18, 2019, now Pat. No. 10,720,460, which is a
(Continued)

(51) Int. Cl.
*H01L 27/146*    (2006.01)
*H01L 21/02*    (2006.01)

(52) U.S. Cl.
CPC ...... *H01L 27/1462* (2013.01); *H01L 21/0206* (2013.01); *H01L 21/0228* (2013.01);
(Continued)

(58) Field of Classification Search
CPC ............ H01L 27/1462; H01L 21/0206; H01L 21/02181; H01L 27/1464; H01L 21/0228; H01L 27/14685; H01L 27/1463; H01L 27/14621; H01L 27/14636; H01L 27/14627; H01L 21/28194;
(Continued)

(56) References Cited

U.S. PATENT DOCUMENTS 7,749,807 B2   7/2010   Karnezos
8,313,994 B2   11/2012  Clark
(Continued)

FOREIGN PATENT DOCUMENTS

CN        1595636 A      3/2005
CN      101901821 A     12/2010
(Continued)

*Primary Examiner* — Victor A Mandala
(74) *Attorney, Agent, or Firm* — Slater Matsil, LLP

(57) ABSTRACT

A method for forming a high dielectric constant (high-κ) dielectric layer on a substrate including performing a pre-clean process on a surface of the substrate. A chloride precursor is introduced on the surface. An oxidant is introduced to the surface to form the high-κ dielectric layer on the substrate. A chlorine concentration of the high-κ dielectric layer is lower than about 8 atoms/cm$^3$.

20 Claims, 4 Drawing Sheets

Related U.S. Application Data continuation of application No. 16/240,929, filed on Jan. 7, 2019, now Pat. No. 10,636,824, which is a division of application No. 14/934,648, filed on Nov. 6, 2015, now Pat. No. 10,177,185.

(60) Provisional application No. 62/158,437, filed on May 7, 2015.

(52) U.S. Cl.
CPC .... H01L 21/02181 (2013.01); H01L 27/1464 (2013.01); H01L 27/14685 (2013.01); *H01L 27/1463* (2013.01); *H01L 27/14621* (2013.01); *H01L 27/14636* (2013.01)

(58) Field of Classification Search
CPC ......... H01L 21/76801; H01L 21/76822; H01L 27/14607; H01L 27/14683
See application file for complete search history.

(56) References Cited

U.S. PATENT DOCUMENTS

| | | | |
|---|---|---|---|
| 8,803,306 B1 | 8/2014 | Yu et al. | |
| 8,883,270 B2 | 11/2014 | Shero et al. | |
| 10,177,238 B2* | 1/2019 | Chang | H01L 21/321 |
| 2001/0024387 A1* | 9/2001 | Raaijmakers | H01L 21/02183 365/200 |
| 2002/0098627 A1 | 7/2002 | Pomarede et al. | |
| 2004/0238872 A1 | 12/2004 | Lee et al. | |
| 2004/0256664 A1* | 12/2004 | Chou | H01L 21/28194 257/324 |
| 2005/0059233 A1 | 3/2005 | Wang et al. | |
| 2006/0211224 A1 | 9/2006 | Matsuda | |
| 2007/0004136 A1* | 1/2007 | Dong | H01L 21/76224 438/257 |
| 2007/0049053 A1 | 3/2007 | Mahajan | |
| 2010/0024387 A1 | 2/2010 | Marche | |
| 2010/0304520 A1 | 12/2010 | Hiyama | |
| 2012/0098107 A1 | 4/2012 | Raisanen et al. | |
| 2012/0147241 A1 | 6/2012 | Yamaguchi et al. | |
| 2013/0193538 A1 | 8/2013 | JangJian et al. | |
| 2013/0285130 A1 | 10/2013 | Ting et al. | |
| 2014/0263958 A1 | 9/2014 | Her et al. | |
| 2019/0035826 A1* | 1/2019 | Kawahara | H01L 27/1462 |
| 2019/0051542 A1* | 2/2019 | Liu | H01L 21/67069 |

FOREIGN PATENT DOCUMENTS

| | | |
|---|---|---|
| CN | 102625861 A | 8/2012 |
| KR | 20030051873 A | 6/2003 |
| KR | 101251133 B1 | 4/2013 |
| KR | 20130120411 A | 11/2013 |
| TW | 201041037 A | 11/2010 |
| TW | 201436183 A | 9/2014 |

\* cited by examiner

HIGH DIELECTRIC CONSTANT DIELECTRIC LAYER FORMING METHOD, IMAGE SENSOR DEVICE, AND MANUFACTURING METHOD THEREOF

PRIORITY CLAIM AND CROSS-REFERENCE

This application is a continuation of U.S. patent application Ser. No. 16/718,581, filed on Dec. 18, 2019, entitled "High Dielectric Constant Dielectric Layer Forming Method, Image Sensor Device, and Manufacturing Method Thereof," which is a continuation of U.S. patent application Ser. No. 16/240,929, filed on Jan. 7, 2019, now U.S. Pat. No. 10,636,824, issued on Apr. 28, 2020, entitled "High Dielectric Constant Dielectric Layer Forming Method, Image Sensor Device, and Manufacturing Method Thereof," which is a divisional of U.S. patent application Ser. No. 14/934,648, filed on Nov. 6, 2015, now U.S. Pat. No. 10,177,185 issued on Jan. 8, 2019, entitled "High Dielectric Constant Dielectric Layer Forming Method, Image Sensor Device, and Manufacturing Method Thereof," which claims priority to U.S. Provisional Application No. 62/158,437, filed on May 7, 2015, which applications are hereby incorporated herein by reference in their entireties.

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array (or grid) for detecting light and recording an intensity (brightness) of the detected light. The pixel array responds to the light by accumulating a charge—for example, the higher the intensity of the light, the higher the charge accumulated in the pixel array. The accumulated charge is then used (for example, by other circuitry) to provide a color and brightness for use in a suitable application, such as a digital camera.

One type of image sensor device is a backside illuminated (BSI) image sensor device. BSI image sensor devices are used for sensing a volume of light projected towards a backside surface of a substrate (which supports the image sensor circuitry of the BSI image sensor device). The pixel grid is located at a front side of the substrate, and the substrate is thin enough so that light projected towards the backside of the substrate can reach the pixel grid. BSI image sensor devices provide a high fill factor and reduced destructive interference, as compared to front-side illuminated (FSI) image sensor devices. Due to device scaling, improvements to BSI technology are continually being made to further improve image quality of BSI image sensor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
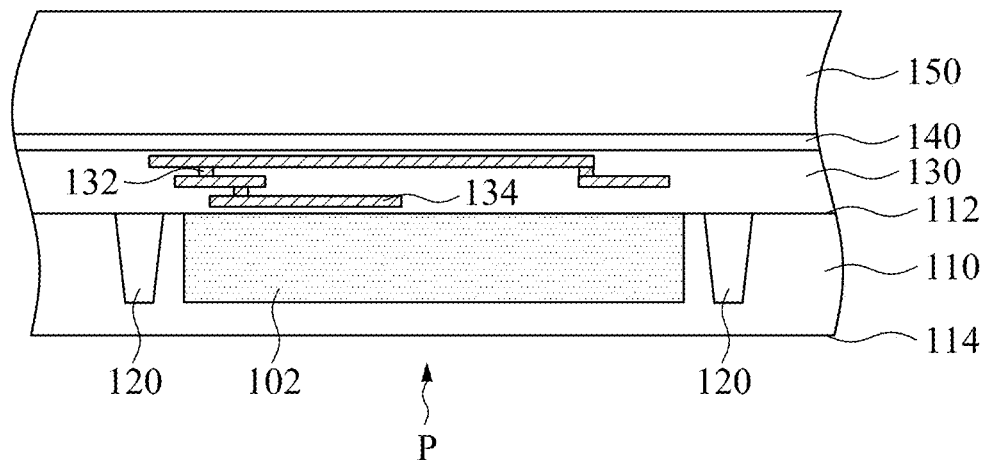
FIGS. 1A to 1F are cross-sectional views of a method for manufacturing an image sensor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of forming a backside illuminated (BSI) image sensor device, a high dielectric constant (high-κ) dielectric layer is formed on a substrate to be a bottom anti-reflective coating (BARC) layer of the image sensor device. The BARC layer formed of the high-κ dielectric layer has accumulate charge ability, improving dark current, white pixel, and dark image non-uniformity (DINU) quality issues. In some embodiments, the high-κ dielectric layer is formed by ALD process and using metal chloride as a precursor. The chlorine concentration of the formed high-κ dielectric layer related to the adhesion between the high-κ dielectric layer and the substrate. To improve the adhesion and the delamination problems of the high-κ dielectric layer, an image sensor device and a method for manufacturing thereof are provided in the following paragraphs.

FIGS. 1A to 1F are cross-sectional views of a method for manufacturing an image sensor device at various stages in accordance with some embodiments of the present disclosure. The image sensor device includes an array of pixels P, and the pixels P can be arranged into columns and rows. The term "pixel" refers to a unit cell containing features (for example, a photodetector and various circuitry, which may include various semiconductor devices) for converting electromagnetic radiation to an electrical signal. For simplicity, the image sensor device including a single pixel P are described in the present disclosure; however, typically an array of such pixels may form the image sensor device illustrated in FIG. 1A.

The pixels P may include photodiodes, complementary metal oxide semiconductor (CMOS) image sensor devices, charged coupling device (CCD) sensors, active sensors, passive sensors, other sensors, or combinations thereof. The pixels P may be designed as having various sensor types. For example, one group of pixels P may be CMOS image sensor devices and another group of pixels P may be passive sensors. Moreover, the pixels P may include color image sensor devices and/or monochromatic image sensor devices. In an example, at least one of the pixels P is an active pixel sensor, such as a CMOS image sensor device. In FIG. 1A, the pixel P may include a photodetector, such as a photogate-type photodetector, for recording an intensity or brightness of light (radiation). The pixel P may also include various semiconductor devices, such as various transistors including a transfer transistor, a reset transistor, a source-follower transistor, a select transistor, other suitable transistor, or combinations thereof. Additional circuitry, an input, and/or an output may be coupled to the pixel array to provide an operation environment for the pixel P and support external communications with the pixel P. For example, the pixel array may be coupled with readout circuitry and/or control circuitry. The pixel P, though drawn schematically identically, may be varied from one another to have different junction depths, thicknesses, widths, and so forth.

In FIG. 1A, the image sensor device is a BSI image sensor device. The image sensor device may be an integrated circuit (IC) chip, system on chip (SoC), or portion thereof, that includes various passive and active microelectronic components, such as resistors, capacitors, inductors, diodes, metal-oxide-semiconductor field effect transistors (MOSFETs), CMOS transistors, bipolar junction transistors (BJTs), laterally diffused MOS (LDMOS) transistors, high power MOS transistors, fin-like field effect transistors (FinFETs), other suitable components, or combinations thereof. FIG. 1A has been simplified for the sake of clarity to better understand the inventive concepts of the present disclosure. Additional features can be added in the image sensor device, and some of the features described below can be replaced or eliminated for other embodiments of the image sensor device.

The image sensor device includes a substrate 110 having a front surface 112 and a back surface 114. In FIG. 1A, the substrate 110 is a semiconductor substrate including silicon. Alternatively or additionally, the substrate 110 includes another elementary semiconductor, such as germanium and/or diamond; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The substrate 110 may be a semiconductor on insulator (SOI). The substrate 110 may include a gradient semiconductor layer, and/or a semiconductor layer overlying another semiconductor layer of a different type, such as a silicon layer on a silicon germanium layer. In FIG. 1A, the substrate 110 can be a p-type substrate. P-type dopants that the substrate 110 is doped with include boron, gallium, indium, other suitable p-type dopants, or combinations thereof. The substrate 110 may alternatively be an n-type doped substrate. N-type dopants that the substrate 110 can be doped with include phosphorus, arsenic, other suitable n-type dopants, or combinations thereof. The substrate 110 may include various p-type doped regions and/or n-type doped regions. Doping may be implemented using a process such as ion implantation or diffusion in various steps and techniques. The thickness of the substrate 110 may range between about 100 microns (μm) and about 3,000 μm.

The substrate 110 includes isolation features 120, such as local oxidation of silicon (LOCOS) and/or shallow trench isolation (STI), to separate (or isolate) various regions and/or devices formed on or within the substrate 110. For example, the isolation features 120 isolate the pixel P from adjacent pixels. In FIG. 1A, the isolation features 120 are STIs. The isolation features 120 include silicon oxide, silicon nitride, silicon oxynitride, other insulating material, or combinations thereof. The isolation features 120 are formed by any suitable process. As some examples, forming an STI includes a photolithography process, etching a trench in the substrate (such as by using a dry etching, wet etching, or combinations thereof), and filling the trench (for example, by using a chemical vapor deposition process) with one or more dielectric materials. In some examples, the filled trench may have a multi-layer structure, such as a thermal oxide liner layer filled with silicon nitride or silicon oxide. In some other examples, the STI structure may be created using a processing sequence such as: growing a pad oxide, forming a low pressure chemical vapor deposition (LPCVD) nitride layer over the pad oxide, patterning an STI opening in the pad oxide and nitride layer using photoresist and masking, etching a trench in the substrate in the STI opening, optionally growing a thermal oxide trench liner to improve the trench interface, filling the trench with oxide, using chemical mechanical polishing (CMP) processing to etch back and planarize, and using a nitride stripping process to remove the nitride layer.

As mentioned above, the pixel P is formed in the substrate 110. The pixel P detects an intensity (brightness) of radiation directed toward the back surface 114 of the substrate 110. The incident radiation is visual light. Alternatively, the radiation is infrared (IR), ultraviolet (UV), x-ray, microwave, other suitable radiation type, or combinations thereof. The pixel P may be configured to correspond to a specific light wavelength, such as a red, a green, or a blue light wavelength. In other words, the pixel P may be configured to detect an intensity (brightness) of a particular wavelength of light. In FIG. 1A, the pixel P includes a photodetector, such as a photodiode, that includes a light-sensing region (or photo-sensing region) 102. The light-sensing region 102 is a doped region having n-type and/or p-type dopants formed in the substrate 110, along the front surface 112 of the substrate 110, such that the light-sensing region 102 faces the front surface 112. In FIG. 1A, the light-sensing region 102 may be an n-type doped region. The light-sensing region 102 is formed by a method such as diffusion and/or ion implantation. Although not shown in FIG. 1A, the pixel P further includes various transistors, such as a transfer transistor associated with a transfer gate, a reset transistor associated with a reset gate, a source-follower transistor, a select transistor, other suitable transistors, or combinations thereof. The light-sensing region 102 and various transistors (which can collectively be referred to as pixel circuitry) allow the pixel P to detect the intensity of the particular light wavelength. Additional circuitry, inputs, and/or outputs may be provided for the pixel P to provide an operation environment for the pixel P and/or support communication with the pixel P.

Subsequently, an interconnect structure 130 is formed over the front surface 112 of the substrate 110, including over the pixel P. The interconnect structure 130 is coupled to various components of the BSI image sensor device, such as the pixel P, such that the various components of the BSI image sensor device are operable to properly respond to illuminated light (imaging radiation). The interconnect structure 130 may include a plurality of patterned dielectric layers and conductive layers that provide interconnections (e.g., wiring) between the various doped features, circuitry, and input/output of the image sensor device. The interconnect structure 130 may further include an interlayer dielectric (ILD) and a multilayer interconnect (MLI) structure. In FIG. 1A, the interconnect structure 130 includes various conductive features, which may be vertical interconnects, such as vias 132, and/or horizontal interconnects, such as lines 134. The various conductive features (i.e., the vias 132 and the lines 134) include conductive materials, such as metals. In some examples, metals including aluminum, aluminum/silicon/copper alloy, titanium, titanium nitride, tungsten, polysilicon, metal silicide, or combinations thereof, may be used. In some embodiments, the various conductive features (i.e., the vias 132 and the lines 134) may be referred to as aluminum interconnects. Aluminum interconnects may be formed by a process including physical vapor deposition (PVD), chemical vapor deposition (CVD), or combinations thereof. Other manufacturing techniques used to form the various conductive features (i.e., the vias 132 and the lines 134) may include photolithography processing and etching to pattern conductive materials to form the vertical and horizontal connects. Still other manufacturing processes may be implemented to form the interconnect structure 130, such as a thermal annealing to form a metal silicide. The metal silicide used in multilayer interconnects may include nickel silicide, cobalt silicide, tungsten silicide, tantalum silicide, titanium silicide, platinum silicide, erbium silicide, palladium silicide, or combinations thereof. Alternatively, the various conductive features (i.e., the vias 132 and the lines 134) may be copper multilayer interconnects, which include copper, copper alloy, titanium, titanium nitride, tantalum, tantalum nitride, tungsten, polysilicon, metal silicide, or combinations thereof. The copper interconnects may be formed by a process including PVD, CVD, or combinations thereof. It should be understood that the conductive features (i.e., the vias 132 and the lines 134) illustrated are exemplary, and the actual positioning and configuration of the conductive features (i.e., the vias 132 and the lines 134) may vary depending on design needs.

In some embodiments, a buffer layer 140 can be formed on the interconnect structure 130. In FIG. 1A, the buffer layer 140 includes a dielectric material such as silicon oxide. Alternatively, the buffer layer 140 may optionally include silicon nitride. The buffer layer 150 is formed by CVD, PVD, or other suitable techniques. The buffer layer 150 may be planarized to form a smooth surface by a CMP process.

Subsequently, a carrier wafer 150 may be further bonded with the substrate 110 through the buffer layer 140, so that processing the back surface 114 of the substrate 110 can be performed. The carrier wafer 150 in the present embodiment is similar to the substrate 110 and includes a silicon material. Alternatively, the carrier wafer 150 may include a glass substrate or another suitable material. The carrier wafer 150 may be bonded to the substrate 110 by molecular forces—a technique known as direct bonding or optical fusion bonding—or by other bonding techniques known in the art, such as metal diffusion or anodic bonding.

The buffer layer 140 provides electrical isolation between the substrate 110 and the carrier wafer 150. The carrier wafer 150 provides protection for the various features formed on the front surface 112 of the substrate 110, such as the pixel P. The carrier wafer 150 also provides mechanical strength and support for processing the back surface 114 of the substrate 110 as discussed below. After bonding, the substrate 110 and the carrier wafer 150 may optionally be annealed to enhance bonding strength.

Figure 1B:
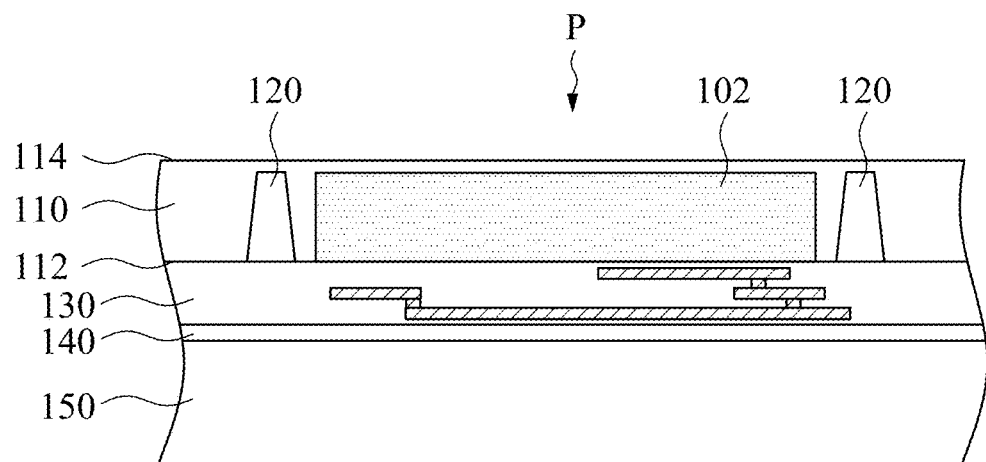

Reference is made to FIG. 1B. After finishing the CMOS processes on the front surface 112 of the substrate 110, the substrate 110 is flipped and a thinning process may be performed from the back surface 114 to thin the substrate 110. The thinning process may include a mechanical grinding process and a chemical thinning process. A substantial amount of substrate material may be first removed from the substrate 110 during the mechanical grinding process. Afterwards, the chemical thinning process may apply an etching chemical to the back surface 114 of the substrate 110 to further thin the substrate 110 to a desired thickness. When the substrate 110 is a SOI type, the embedded buried oxide layer (BOX) can act as an etching stop layer. The thickness of the substrate 110 in a BSI image sensor device is about 5-10 µm. In some embodiments, the thickness may be less than about 5 µm, even down to about 2-3 µm. The thickness of the substrate 110 may be implemented depending on the type of applications of the image sensor device.

Subsequently, a high dielectric constant (high-κ) dielectric layer 160 (see FIG. 1E) is formed on the back surface 114 of the substrate 110. The high-κ dielectric layer 160 can be a bottom anti-reflective coating (BARC) layer of the image sensor device. In greater detail, a pre-clean process of the back surface 114 of the substrate 110 may be performed to remove a native oxide on the back surface 114 to create a hydrogen-terminated (OH) surface. This can be accomplished using a diluted hydrofluoric acid (DHF) treatment or a vapor hydrofluoric acid (VHF) treatment for a suitable time.

Figure 1C:
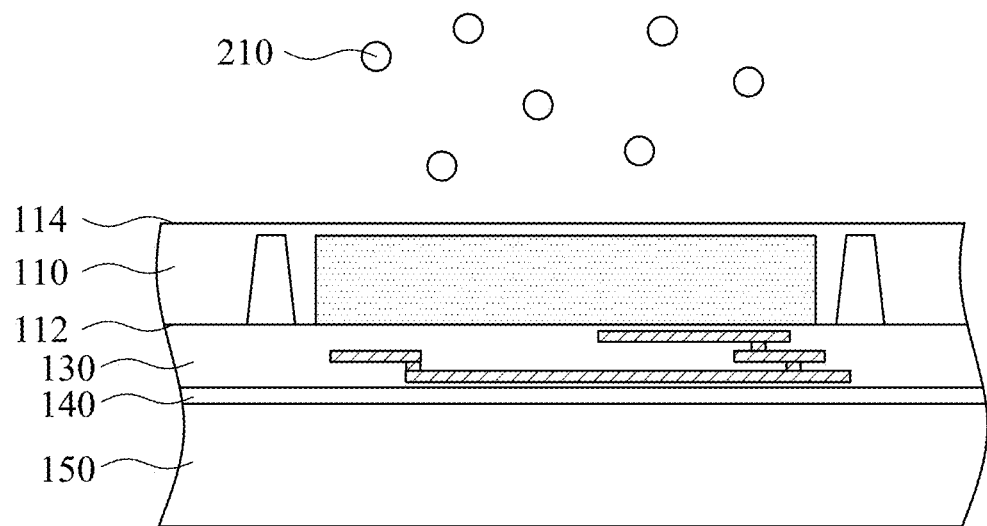
Figure 1D:
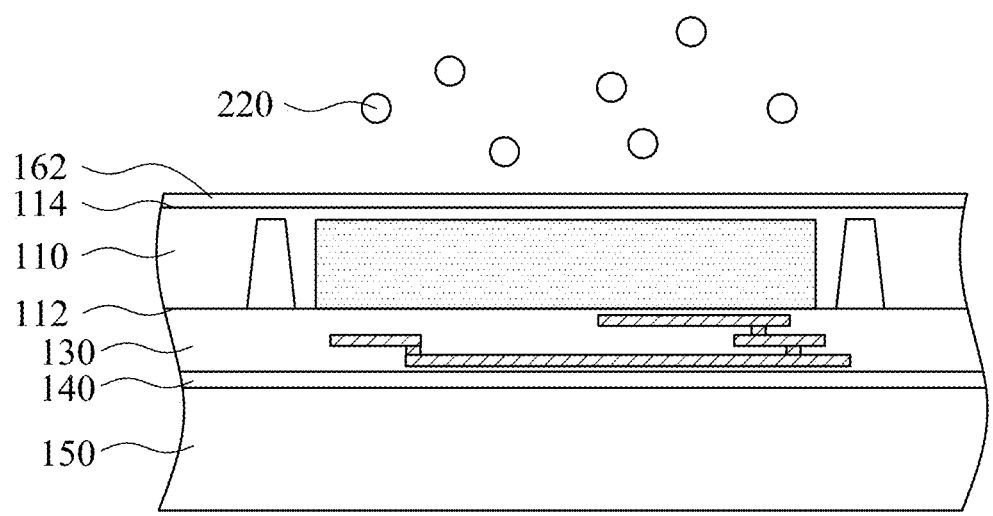

Reference is made to FIGS. 1C and 1D. A pulse of a chloride precursor 210 is introduced on the back surface 114 of the substrate 110 for a first time period. In some embodiments, the chloride precursor is a metal chloride, such as lanthanum chloride ($LaCl_3$), hafnium tetrachloride ($HfCl_4$), or zirconium tetrachloride ($ZrCl_4$). The chloride precursor 210 of FIG. 1C reacts with the OH surface (i.e., the back surface 114) to form metal oxide bonding 162, as shown in FIG. 1D. The un-reacted portion of the chloride precursor 210 is removed from the back surface 114. In some embodiments, the first time period is about 0.5 seconds to about 2 seconds, depending on real situations.

Figure 1E:
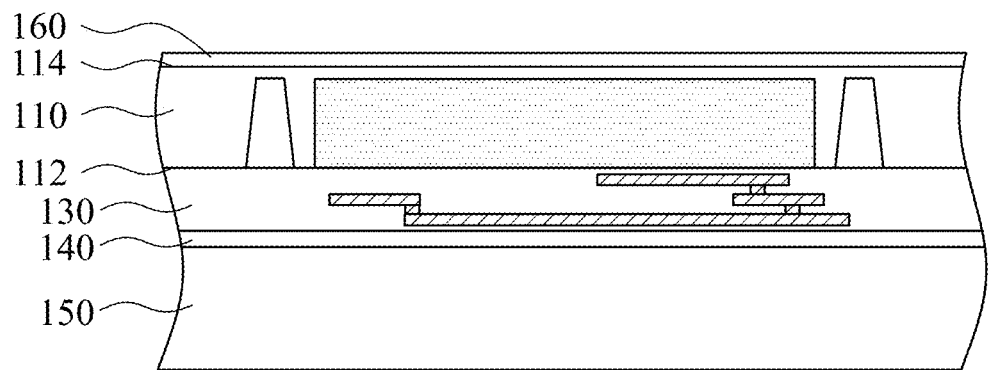

Reference is made to FIGS. 1D and 1E. Subsequently, an oxidant 220 is introduced to the back surface 114 for a second time period. In some embodiments, the oxidant 220 is water ($H_2O$). Water molecules react with metal oxide bonding 162. The chlorine of the metal oxide bonding 162 can be replaced by OH— ions of the water, such that the high-κ dielectric layer 160 is formed, as shown in FIG. 1E. In some embodiments, the high-κ dielectric layer 160 is made of lanthanum oxide, hafnium oxide, zirconium oxide, or combinations thereof. A dielectric constant of the high-κ dielectric layer 160 is higher than the dielectric constant of $SiO_2$, i.e. κ is greater than about 3.9. The process cycle can continue, for example, by introducing chloride precursor to react with OH terminated surface. In some embodiments, the second time period is equal to or longer than about 0.5 seconds. In some other embodiments, the second time period is about 0.5 seconds to about 1.5 seconds, depending on real situations.

In some embodiments, after the oxidant 220 is introduced, another oxidant can be introduced to the back surface 114 to further replaces the chlorine of the metal oxide bonding 162 for the second time period. The oxidant can be ozone. Since the chlorine is efficiently replaced, the chlorine of the high-κ dielectric layer 160 is further reduced. In some embodiments, the chlorine concentration of the high-κ dielectric layer is lower than about 8 atoms/cm³. In some other embodiments, the chlorine concentration of the high-κ dielectric layer is lower than about 5 atoms/cm³.

During the manufacturing process of the image sensor device, water is used and will dissociation to give hydrogen ions, which react with the chlorine to form hydrochloric acid (HCl). The hydrochloric acid will corrode the high-κ dielectric layer 160, thereby reducing the adhesion between the high-κ dielectric layer 160 and the substrate 110, and causing the high-κ dielectric layer 160 delaminate. However, in FIG. 1E, since the chlorine concentration of the high-κ dielectric layer 160 is lower than about 8 atoms/cm³, the concentration of the formed hydrochloric acid is relative low. Hence, the adhesion and the delaminating problem can be improved, as shown in the following table 1.

Table 1 is the experimental results of delamination defect density between the high-κ dielectric layer and the substrate. In table 1, the high-κ dielectric layer was made of $HfO_2$, the substrate was made of silicon, and the chloride precursor was $HfCl_4$. Table 1 shows the chlorine (Cl) concentration is reduced when the second time period is increased, and the defect density is reduced when the chlorine concentration of the high-κ dielectric layer is lower. For example, when the second time period is about 0.5 seconds, the chlorine concentration is reduced to about 8 atoms/cm³, and the defect density drops from about 55 NO./mm² to about 16 NO./mm². Furthermore, when the second time period is about 1.5 seconds, the chlorine concentration is reduced to about 5 atoms/cm³, and the defect density further drops to about 0 NO./mm².

sensor device. For example, a passivation layer may be formed around the image sensor device for protection (for example against dust or humidity). A color filter 170 is formed on the high-κ dielectric layer 160 and is aligned with the light-sensing region 102 of the pixel P. The color filter 170 may be positioned such that the incoming light is directed thereon and therethrough. The color filter 170 may include a dye-based (or pigment based) polymer or resin for filtering a specific wavelength band of the incoming light, which corresponds to a color spectrum (e.g., red, green, and blue).

In some embodiments, a micro-lens is formed on the color filter 170 for directing and focusing the incoming light toward specific radiation-sensing regions in the substrate 110, such as the pixel P. The micro-lens may be positioned in various arrangements and have various shapes depending on a refractive index of material used for the micro-lens and distance from a sensor surface. It is also understood that the substrate 110 may also undergo an optional laser annealing process before the forming of the color filter 170 or the micro-lens.

Figure 1F:
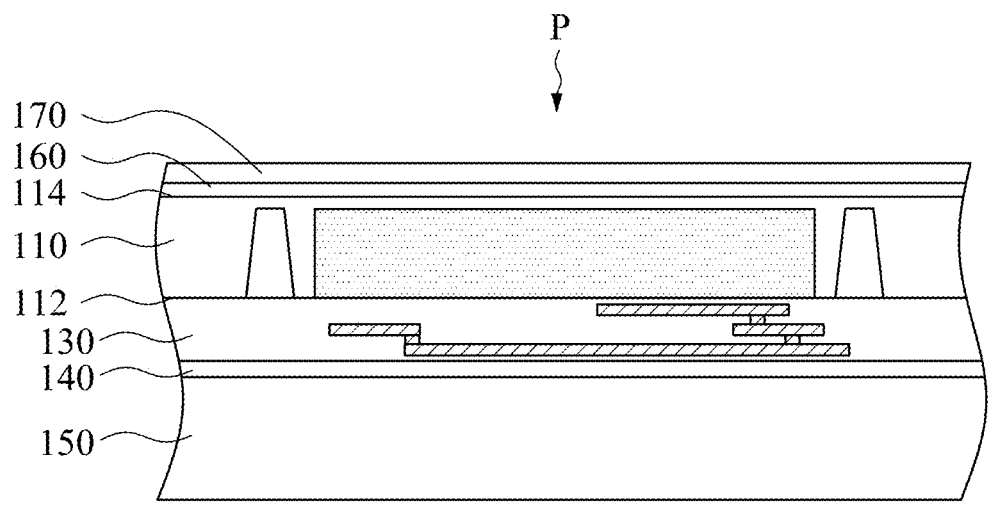
Figure 2:
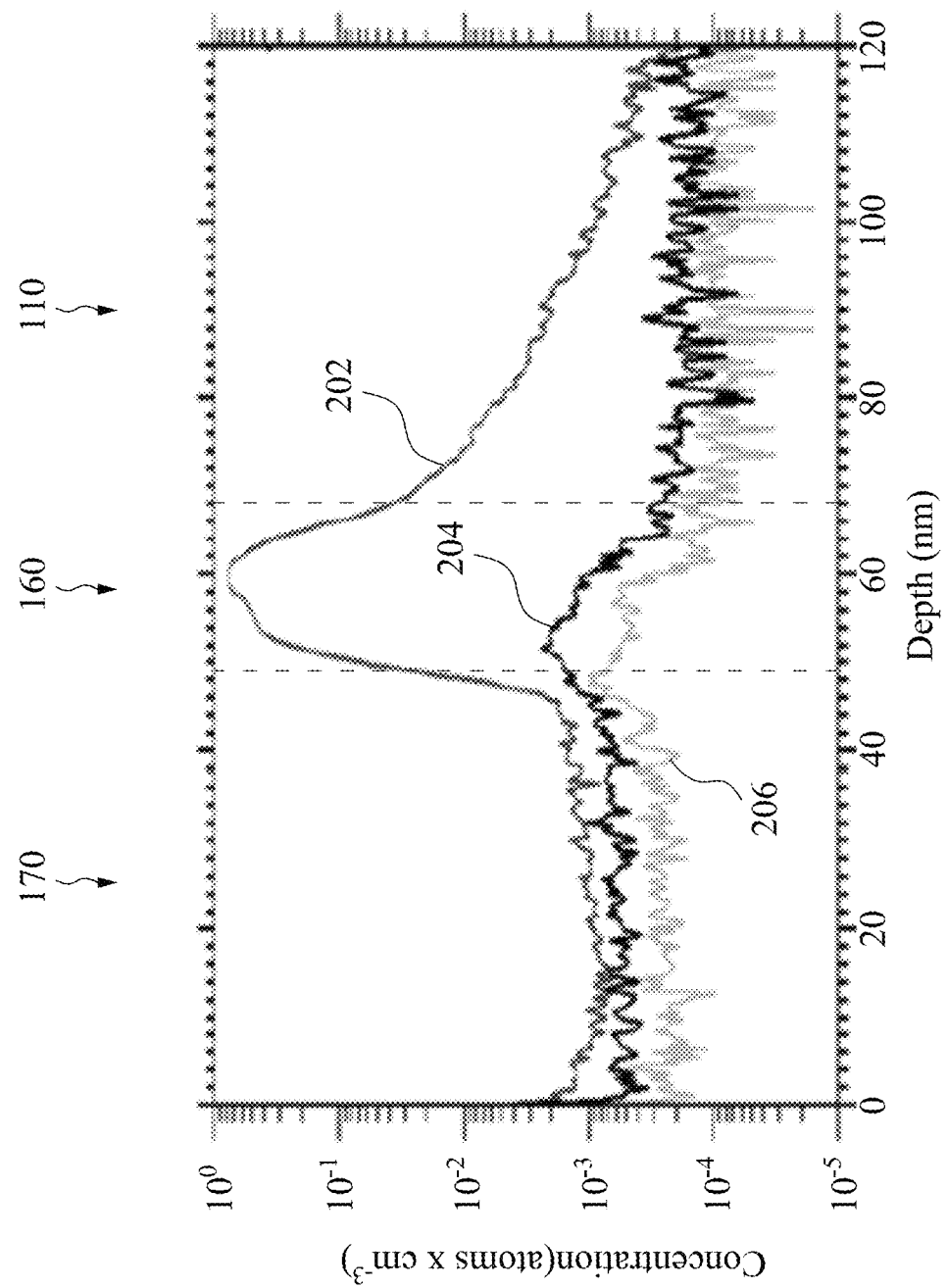
FIG. 2 is a graph of various atom concentrations vs. depth of the color filter, the high-κ dielectric layer, and the substrate of the image sensor device in FIG. 1F.

FIG. 2 is a graph of various atom concentrations vs. depth of the color filter 170, the high-κ dielectric layer 160, and the substrate 110 of the image sensor device in FIG. 1F. In FIG. 2, the color filter 170 was made of oxide, the high-κ dielectric layer 160 was made of $HfO_2$, and the substrate 110 was made of silicon. Line 202 represents the chlorine concentration, line 204 represents the fluorine concentration, and line 206 represents the carbon concentration. In FIG. 2, the Cl concentration was lower than 1 atom/cm³.

TABLE 1

| Cl concentration (atoms/cm³) | Cl concentration deviation (%) | Pressure (Torr) | First time period (sec) | Second time period (sec) | Defect density (NO./mm²) |
|---|---|---|---|---|---|
| 11 | +33% | 2.5 | 0.5 | 0.25 | 58 |
| 16 | +94% | 3.5 | 2.0 | 0.25 | 60 |
| 14 | +71% | 1.5 | 1.0 | 0.25 | 55 |
| 8 | 0% | 2.5 | 1.0 | 0.5 | 16 |
| 7.68 | −4% | 3.5 | 0.5 | 0.5 | 18 |
| 7.92 | −1% | 1.5 | 2.0 | 0.5 | 14 |
| 5.52 | −31% | 2.5 | 2.0 | 1.5 | 0 |
| 4.16 | −48% | 3.5 | 1.0 | 1.5 | 0 |
| 3.28 | −59% | 1.5 | 0.5 | 1.5 | 0 |

Reference is made to FIG. 1E. The high-κ dielectric layer 160 as the BARC layer mostly has accumulated charges (mostly negative but in some case positive). The charge accumulated ability of the high-κ dielectric layer 160 improves dark current, which is current that flows in the image sensor device in absence of incident light on the image sensor device, white pixel, which occurs where an excessive amount of current leakage causes an abnormally high signal from the pixels, and dark image non-uniformity (DINU) quality issues. When the high-κ dielectric layer 160 have negative (positive) charges accumulated, they attract positive (negative) charges in the substrate 110 to the high-κ dielectric layer/substrate interface to form electric dipoles. That is, the negative (positive) charges increase hole (electron) accumulation at the interface and creates a depletion region at or close to the interface. The electric dipoles play the role of a charge barrier, trapping the imperfections or defects such as dangling bonds.

Reference is made to FIG. 1F. An additional processing may be performed to complete the fabrication of the image According to the aforementioned embodiments, the high-κ dielectric layer can be formed using ALD process. The chloride precursor is used to form the high-κ dielectric layer. Since the oxidant is introduced during the ALD process for substantially equal to or longer than about 0.5 seconds, the chlorine of the chloride precursor can be efficiently replaced by the ions of the oxidant, such that the chlorine concentration of the formed high-κ dielectric layer can be reduced and is lower than about 8 atoms/cm³. The low chlorine concentration improves the delamination problem of the high-κ dielectric layer, and increases the adhesion between the high-κ dielectric layer and the substrate.

According to some embodiments of the present disclosure, a method for forming a high dielectric constant (high-κ) dielectric layer on a substrate includes introducing a chloride precursor on a surface of the substrate. An oxidant is introduced to the surface to form the high-κ dielectric layer on the substrate. A chlorine concentration of the high-κ dielectric layer is lower than about 8 atoms/cm³.

According to some embodiments of the present disclosure, a method for manufacturing an image sensor device includes forming a light sensing region in a substrate. The light sensing region faces a front surface of the substrate. A high dielectric constant (high-κ) dielectric layer is formed on a back surface of the substrate opposite to the front surface by using an atomic layer deposition (ALD) process. A precursor of the ALD process comprises chlorine, and an oxidant is introduced during the ALD process for substantially equal to or longer than about 0.5 seconds.

According to some embodiments of the present disclosure, an image sensor device includes a substrate and a high dielectric constant (high-κ) dielectric layer. The substrate has a front surface and a back surface opposite to the front surface. The substrate further has a light sensing region facing the front surface. The high dielectric constant (high-κ) dielectric layer is disposed on the back surface of the substrate. A chlorine concentration of the high-κ dielectric layer is lower than about 8 atoms/cm$^3$.

According to some embodiments of the present disclosure, a device includes a substrate having a front surface and a back surface opposite to the front surface. The substrate further has a light sensing region abutting the front surface. The device further includes a high dielectric constant (high-κ) dielectric layer disposed on the back surface of the substrate. A chlorine concentration of the high-κ dielectric layer is less than about 8 atoms/cm$^3$.

According to some embodiments of the present disclosure, a device includes a substrate having a front surface and a back surface opposite to the front surface, a light sensing region within the substrate and adjacent the front surface of the substrate, and a dielectric layer on the back surface of the substrate. A chlorine concentration of the dielectric layer is less than about 8 atoms/cm$^3$.

According to some embodiments of the present disclosure, a device includes a substrate having a front surface and a back surface opposite to the front surface, and a light sensing region within the substrate. A surface of the light sensing region is level with the front surface of the substrate. The device further includes an interconnect structure on the front surface of the substrate, and a dielectric layer on the back surface of the substrate. A chlorine concentration of the dielectric layer is less than about 5 atoms/cm$^3$.

According to some embodiments of the present disclosure, a method includes forming a light sensing region in a substrate. The substrate has a first surface and a second surface opposite to the first surface. The light sensing region is spaced apart from the first surface of the substrate. A first precursor is introduced over the first surface of the substrate. The first precursor includes a metal chloride. The first precursor reacts with the first surface of the substrate to form a metal oxide bonding layer over the first surface of the substrate. A second precursor is introduced over the first surface of the substrate. The second precursor includes an oxidant. The second precursor reacts with the metal oxide bonding layer to transform the metal oxide bonding layer into a dielectric layer. A chlorine concentration of the dielectric layer is less than about 8 atoms/cm$^3$.

According to some embodiments of the present disclosure, a method includes forming a light sensing region in a substrate. The substrate has a first surface and a second surface opposite to the first surface. A surface of the light sensing region is substantially level with the second surface of the substrate. A dielectric layer is formed on the first surface of the substrate. Forming the dielectric layer on the first surface of the substrate includes forming a chlorine-containing layer over the first surface of the substrate. A chorine amount is reduced in the chlorine-containing layer to a first chlorine concentration. The first chlorine concentration is less than about 5 atoms/cm$^3$.

According to some embodiments of the present disclosure, a method includes forming a light sensing region in a substrate. An interconnect structure is formed on a first side of the substrate. The light sensing region abuts the interconnect structure. A dielectric layer is formed on a second side of the substrate. The second side is opposite to the first side. Forming the dielectric layer on the second side of the substrate includes performing a surface treatment process on the second side of the substrate. The surface treatment process forms an OH-terminated surface on the second side of the substrate. A metal chloride precursor is introduced over the second side of the substrate. The metal chloride precursor reacts with the OH-terminated surface to form a metal oxide bonding layer over the second side of the substrate. A first oxidant is introduced over the metal oxide bonding layer. The first oxidant reacts with the metal oxide bonding layer and reduces a chlorine content of the metal oxide bonding layer to a first chlorine concentration. A second oxidant is introduced over the metal oxide bonding layer. The second oxidant is different from the first oxidant. The second oxidant reacts with the metal oxide bonding layer and reduces the chlorine content of the metal oxide bonding layer to a second chlorine concentration less than the first chlorine concentration.

According to some embodiments of the present disclosure, a device includes a substrate having a front surface and a back surface opposite to the front surface and a light sensing region within the substrate. The light sensing region is spaced apart from the back surface of the substrate. The device further includes a dielectric layer in physical contact with the back surface of the substrate. A chlorine concentration of the dielectric layer is greater than 0 and less than 8 atoms/cm$^3$.

According to some embodiments of the present disclosure, a device includes a substrate having a front surface and a back surface opposite to the front surface and a light sensing region within the substrate. The light sensing region extends from the front surface of the substrate toward the back surface of the substrate. The device further includes a dielectric layer on the back surface of the substrate and spaced apart from the light sensing region. A chlorine concentration of the dielectric layer is greater than 0 and less than 5 atoms/cm$^3$.

According to some embodiments of the present disclosure, a device includes a substrate having a front surface and a back surface opposite to the front surface and a light sensing region within the substrate. A first surface of the light sensing region is level with the front surface of the substrate. The device further includes an interconnect structure in physical contact with the first surface of the light sensing region and a dielectric layer in physical contact with the back surface of the substrate. A chlorine concentration of the dielectric layer is greater than 0 and less than 8 atoms/cm$^3$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a substrate having a front surface and a back surface opposite to the front surface;
a light sensing region within the substrate, the light sensing region being spaced apart from the back surface of the substrate; and
a dielectric layer in physical contact with the back surface of the substrate, wherein a chlorine concentration of the dielectric layer is greater than 0 and less than 8 atoms/cm$^3$.

2. The device of claim 1, further comprising a color filter over the dielectric layer.

3. The device of claim 1, wherein the dielectric layer comprises a high-κ dielectric material.

4. The device of claim 1, further comprising an interconnect structure in physical contact with the front surface of the substrate.

5. The device of claim 4, wherein the light sensing region is in physical contact with the interconnect structure.

6. The device of claim 1, further comprising an isolation region within the substrate, the isolation region being spaced apart from the back surface of the substrate.

7. The device of claim 6, wherein the isolation region is spaced apart from a sidewall of the light sensing region.

8. A device comprising:
a substrate having a front surface and a back surface opposite to the front surface;
a light sensing region within the substrate, the light sensing region extending from the front surface of the substrate toward the back surface of the substrate; and
a dielectric layer on the back surface of the substrate and spaced apart from the light sensing region, wherein a chlorine concentration of the dielectric layer is greater than 0 and less than 5 atoms/cm$^3$.

9. The device of claim 8, wherein the dielectric layer comprises lanthanum oxide, hafnium oxide, or zirconium oxide.

10. The device of claim 8, further comprising an isolation region within the substrate, the isolation region extending from the front surface of the substrate toward the back surface of the substrate.

11. The device of claim 10, wherein a width of the isolation region decreases as the isolation region extends from the front surface of the substrate toward the back surface of the substrate.

12. The device of claim 10, wherein a portion of the substrate is interposed between a sidewall of the isolation region and a sidewall of the light sensing region.

13. The device of claim 10, further comprising an interconnect structure in physical contact with the isolation region and the light sensing region.

14. The device of claim 8, further comprising a color filter in physical contact with the dielectric layer.

15. A device comprising:
a substrate having a front surface and a back surface opposite to the front surface;
a light sensing region within the substrate, a first surface of the light sensing region being level with the front surface of the substrate;
an interconnect structure in physical contact with the first surface of the light sensing region; and
a dielectric layer in physical contact with the back surface of the substrate, wherein a chlorine concentration of the dielectric layer is greater than 0 and less than 8 atoms/cm$^3$.

16. The device of claim 15, wherein a thickness of the substrate is greater than a thickness of the light sensing region.

17. The device of claim 15, further comprising a color filter in physical contact with the dielectric layer.

18. The device of claim 15, further comprising an isolation region within the substrate, the isolation region being in physical contact with the interconnect structure.

19. The device of claim 18, wherein a first portion of the substrate is interposed between the isolation region and the dielectric layer.

20. The device of claim 19, wherein a second portion of the substrate is interposed between the isolation region and the light sensing region.

* * * * *